United States Patent
Costello

[11] Patent Number: 6,124,723
[45] Date of Patent: Sep. 26, 2000

[54] PROBE HOLDER FOR LOW VOLTAGE, LOW CURRENT MEASUREMENTS IN A WATER PROBE STATION

[75] Inventor: Matthew J. Costello, Bethel, Conn.

[73] Assignee: Wentworth Laboratories, Inc., Brookfield, Conn.

[21] Appl. No.: 09/143,843

[22] Filed: Aug. 31, 1998

[51] Int. Cl.[7] .................................................. G01R 31/02
[52] U.S. Cl. ............................................ 324/762; 324/754
[58] Field of Search ...................................... 324/754, 761, 324/762, 755, 760, 72.5, 73.1, 158.1, 757, 758

[56] References Cited

U.S. PATENT DOCUMENTS

| | | | |
|---|---|---|---|
| 5,345,170 | 9/1994 | Schwindt et al. | 324/754 |
| 5,457,398 | 10/1995 | Schwindt et al. | 324/754 |
| 5,506,515 | 4/1996 | Godshalk et al. | 324/762 |
| 5,525,911 | 6/1996 | Marumo et al. | 324/754 |
| 5,663,653 | 9/1997 | Schwindt et al. | 324/754 |

OTHER PUBLICATIONS

"Fixturing for Low–Current/Low Voltage Parametric Testing" article William Knauer, Evaluation Engineering, Nov. 1990, pp. 150–153.

*Primary Examiner*—Glenn W. Brown
*Assistant Examiner*—Minh Tang
*Attorney, Agent, or Firm*—William C. Crutcher

[57] ABSTRACT

A probe holder for a wafer probe station is comprised of a pair of over-and-under rigid extensions, one of which receives the probe shank and the other of which is connected to the probe to make a Kelvin connection. The two coaxial extensions are supported by a vertical tube which contains a pair of coaxial cables connected to triaxial cables outside of the probe station enclosure.

6 Claims, 4 Drawing Sheets

PROBE HOLDER FOR LOW VOLTAGE, LOW CURRENT MEASUREMENTS IN A WATER PROBE STATION

BACKGROUND OF THE INVENTION

This invention relates generally to probe stations for making low voltage, low current measurements on a device under test such as an integrated circuit or a semi-conductor wafer, and more particularly to an improved probe holder for the wafer probe station for using guarding to reduce current leakage during low current measurements and utilizing Kelvin connections to compensate for line resistance voltage drops which would give rise to errors when making low voltage measurements.

The need for, and principles used in, guarded probes with Kelvin connections are well known and laid out in published articles such as "Fixturing for Low-current/low-voltage Parametric Testing", *Evaluation Engineering*, November 1990, pages 150–153 by William Knauer. The probe holders are generally mounted on probe manipulators and are used in a probe station having a moveable chuck to position the device under test. Triaxial cabling from the measuring instruments is usually led to the vicinity of the probe manipulator, utilizing a pair of triaxial cables for each manipulator and probe holder. The two triaxial cables serve as source and measurement lines, which are necessary to establish Kelvin connections with respect to the probe.

The prior art, illustrated in FIGS. 1a, 1b and 1c has generally terminated the triaxial cable pair in an external box or "Faraday-cage" and then used coaxial cables connected to the respective inner and intermediate conductors of the triaxial cables. The coaxial cables were carried inside a tube running through the enclosure wall to the inside of the probe station enclosure, and run to a probe holder adapted to receive a probe needle.

When making Kelvin connections, it is desirable to make the connection as close to the probed area as possible. In view of the congested area around the device under test, it is undesirable to utilize the standard coaxial receptacles and plugs normally used in making coaxial connections.

Accordingly, one object of the present invention is to provide an improved probe holder for guarding and making Kelvin connections in a wafer probe station.

Another object of the invention is to provide an improved probe holder which reduces congestion in the vicinity of the device under test.

Still another object of the invention is to provide an improved and economical, fully guarded probe holder, with provisions for making Kelvin connections.

SUMMARY OF THE INVENTION

Briefly stated, the invention comprises an improved probe holder for making low current, low voltage measurements in a wafer probe station of the type which includes at least one probe manipulator, a moveable chuck adapted to hold a device under test, and a pair of triaxial cables terminating adjacent the probe manipulator, the triaxial cables having coaxially disposed central conductors, intermediate conductors, and exterior conductors insulated from one another. The improved probe holder comprises a triaxial termination box defining a first shielded enclosure having conductive wall portions adapted for connection to the exterior conductors of each of the triaxial conductors, a conductive shielding tube extending downwardly from the triaxial termination box and communicating at the upper end thereof with the first shielded enclosure, a probe holder box having conductive walls connected to the lower end of the shielding tube, the conductive walls defining a second shielded enclosure communicating with the lower end of the shielding tube, first and second coaxial cables each having inner and outer coaxially disposed conductors insulated from one another and extending through the shielding tube between the first and second shielded enclosures and having their outer conductors connected to respective intermediate conductors in the first enclosure and having their inner conductors connected to respective central conductors in the first enclosure, first and second probe extensions, each comprising a conductive core member and a conductive sheath coaxially disposed with respect to the conductive core member and insulated therefrom, the rigid conductive sheaths insulated from the second enclosure conductive walls and connected to the outer conductors inside the second enclosure, and the conductive core members being connected to respective inner conductors inside the second enclosure, and a probe having a shank end supported from at least one of the conductive core members and electrically connected to both of the conductive core members, so as to provide a guarded probe with a Kelvin connection adjacent the device under test.

DRAWINGS

The invention will be better understood by reference to the following description, taken in connection with the accompanying drawings, in which:

FIG. 1a is a side elevational drawing, partly in cross section, of portions of a prior art wafer probe station, with a guarded probe holder, FIG. 1b and FIG. 1c are side elevational and top view respectively of a prior art guarded probe holder as described in U.S. Pat. No. 5,457,398 issued Oct. 10, 1995, FIG. 2 is a side elevational view, partly in cross section, of an improved probe holder according to the present invention, FIG. 3 is an end elevational view, partly in cross section, of the probe holder of FIG. 2, FIG. 4 is an enlarged top plan view, partly in cross section, taken along lines IV—IV of FIG. 2, and FIG. 5 is an enlarged side elevational view, partly in cross section, taken near the probed area of a portion of the probe holder shown in FIG. 2.

DESCRIPTION OF THE PRIOR ART

The environment in which the probe holder of the present invention functions will be better understood by reference to the prior art drawing of FIG. 1a. Portions of a wafer probe station shown generally at 10 include a moveable chuck 12 carried on a chuck support 14 and moveable in x-y and z directions by positioning motors (not shown) inside an enclosure 16. A device under test, such as an integrated circuit on a silicon wafer is held on an upper surface of chuck 12 where it is contacted by a probe 18. The probe 18 is separately moveable by a probe manipulator 20 such as a Model HOP 2000 or CAP 4000 manufactured by applicant's assignee. Probe manipulator 20 is disposed on a table 22 forming the top of enclosure 16 and positions a guarded probe holding assembly shown generally at 24 comprising a shielded Faraday-cage enclosure 26, a vertical tube 28, a horizontal extension 30 and a probe holder 32. The vertical tube 28 extends through a shielded cover assembly 34. Electrical connections to probe 18 are made via two triaxial cables 36, 38 connected to low voltage, low current instruments (not shown) such as Model No. 4284A, manufactured by Hewlett-Packard. The triaxial cables 36, 38 each have coaxially disposed central conductors, intermediate conductors and exterior conductors insulated from one another. The exterior conductors are electrically connected to the walls of the Faraday-cage 26. Inside Faraday-cage 26, the outer conductors of coaxial cables 40, 42 are connected to the respective intermediate conductors of the triaxial cables 36, 38. The inner conductors of the coaxial cables 40, 42 are connected to the respective central conductors of triaxial cables 36, 38. The pair of coaxial cables 40, 42 are carried into enclosure 16 inside of the vertical tube 28 and from there to the probe holder 32, to which they are connected by standard coaxial cable jacks and receptacles. In this manner, guarded and shielded electrical connections are carried to probe 18, with Kelvin connections made at probe holder 32. It will be understood that there will usually be several probe manipulators, probe holding assemblies and guarded probes disposed around the device under test, only one such arrangement being shown for simplicity. A viewing microscope 44 is provided to examine the probe positions with respect to the device under test.

The present invention relates to improvements in the probe holder itself, it being understood that the improved probe holder of the present invention is used in the environment described in connection with FIG. 1a.

Another type of prior art probe holder providing guarded Kelvin connections is seen in FIGS. 1b and 1c in which a probe-holding assembly 223 includes a pair of connectors 128 and 130 of triaxial configuration, each of which are mounted on an outer shielding enclosure or box 126. FIGS. 1b and 1c correspond to FIGS. 15 and 16 respectively of U.S. Pat. No. 5,457,398 issued Oct. 10, 1995. The details of the probe-holding assembly are described in the subject patent commencing at column 18, line 46, and the reference numbers are those used in the subject patent.

DESCRIPTION OF THE PREFERRED EMBODIMENT

Figure 1A:
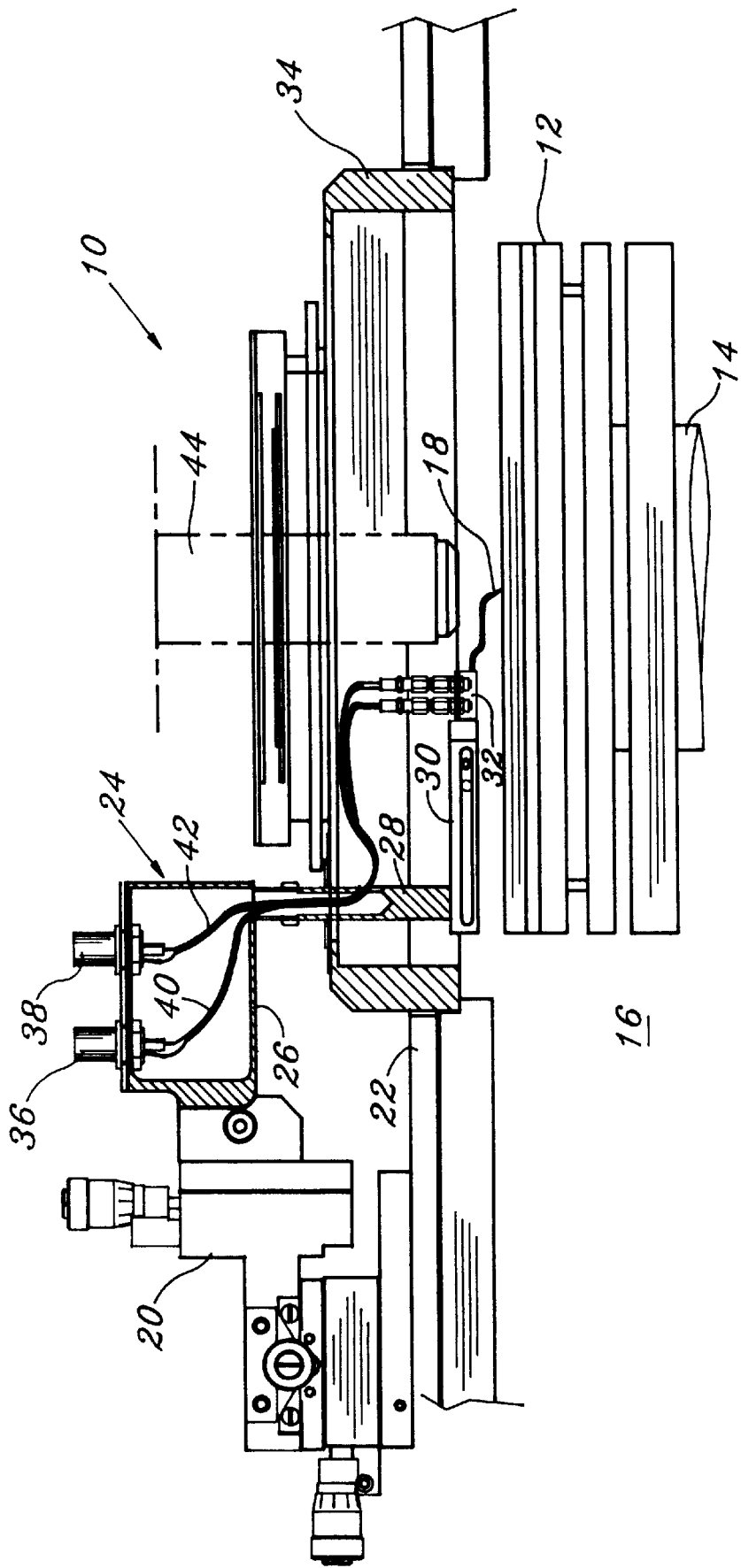
Figure 1B:
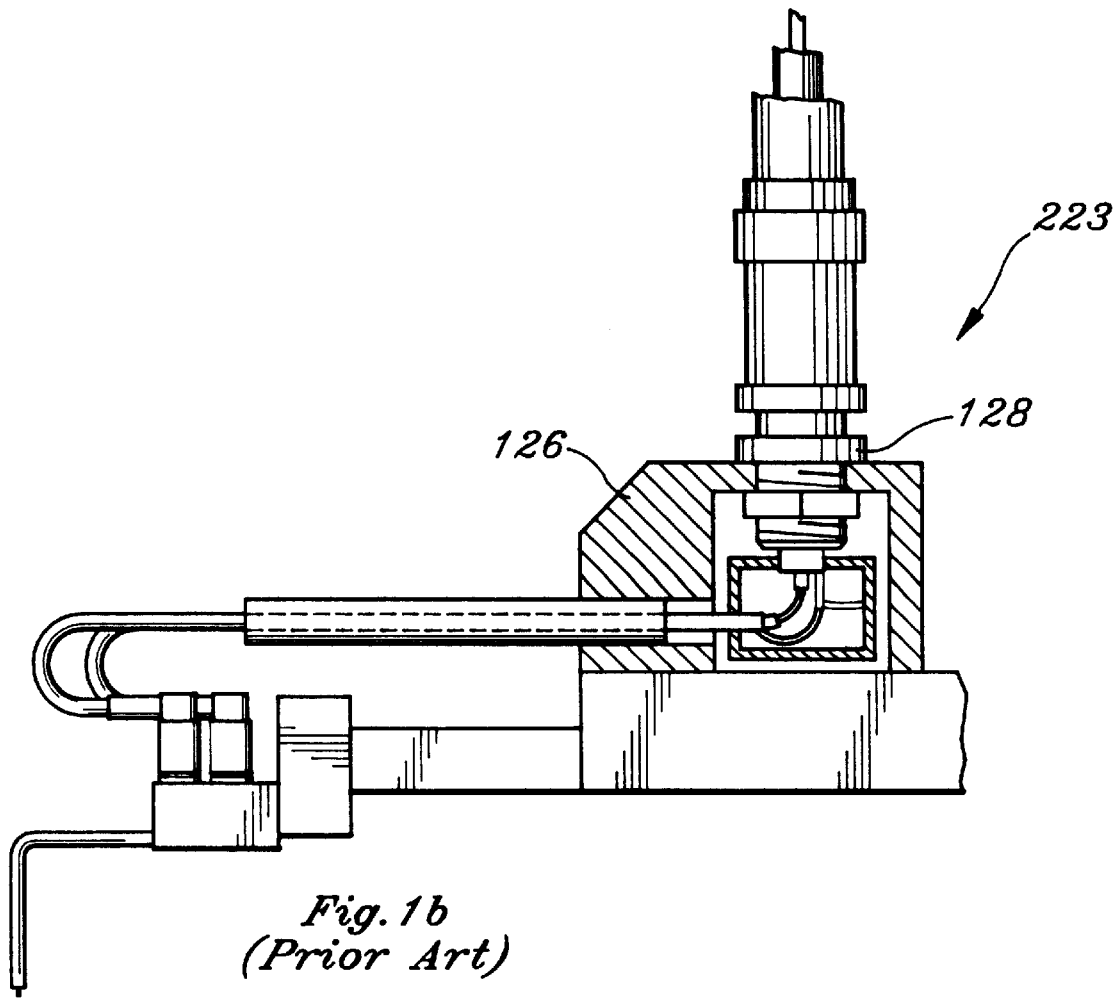
Figure 1C:
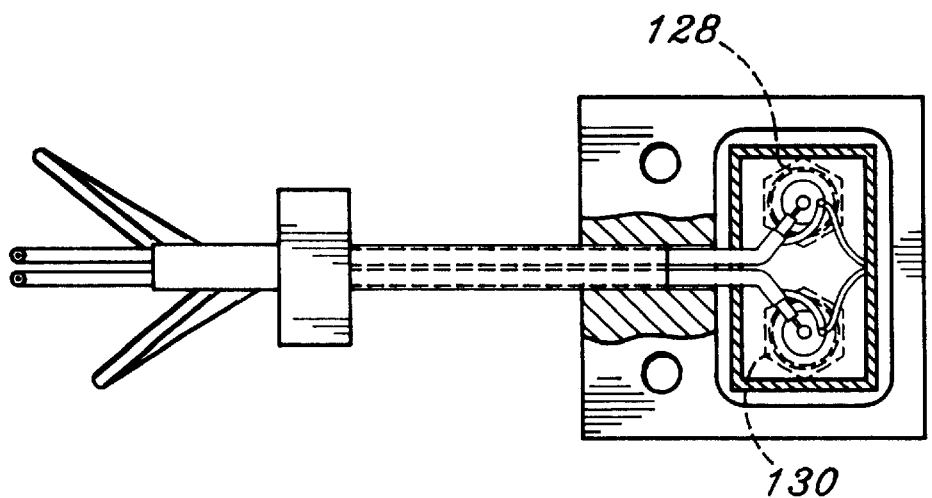
Figures 2, 3:
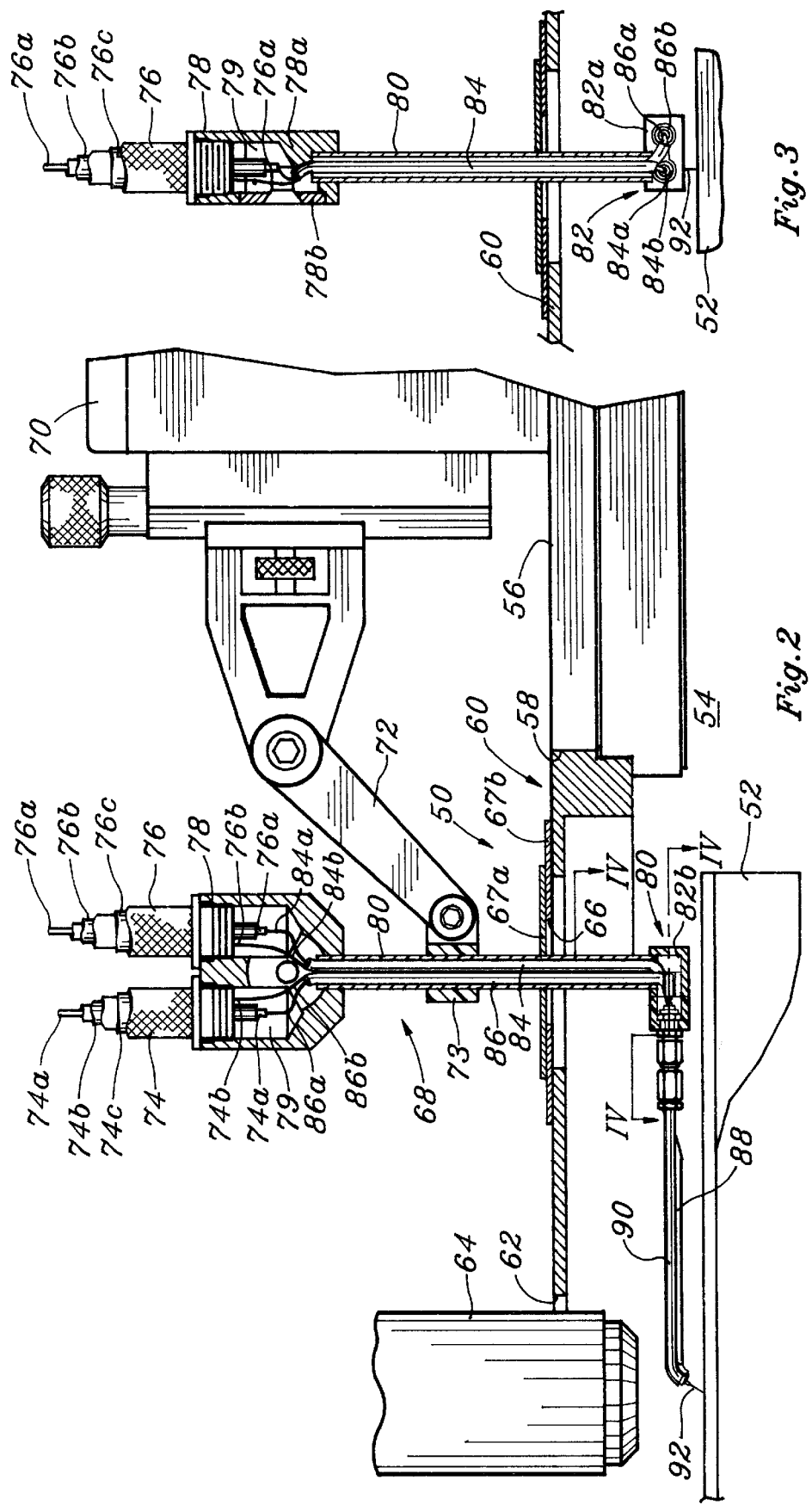

Referring now to FIG. 2 of the drawings, portions of the wafer probe station, shown generally at 50 include a moveable chuck 52 inside an enclosure 54 having a cover or table 56 defining a central opening 58. A cover assembly 60 includes a central opening 62 for a viewing microscope 64 and a series of holes such as 66 disposed around the central opening 62 for the probe holder. The probe holder is shown generally at 68 and will be later described in detail. A probe manipulator 70, for example a CAP 4000 manufactured by the applicant's assignee includes a probe positioning mechanism terminating in an articulated adjustable arm 72. A pair of triaxial cables 74, 76 similar to triaxial cables 36, 38 previously described are connected to the parametric measuring instrumentation as previously described. Each of the triaxial cables has coaxially disposed central conductors 74a, 76a, intermediate conductors 74b, 76b and exterior conductors 74c, 76c.

PROBE HOLDER

My improved probe holder shown generally at 68 is made up of a triaxial termination box 78, a conductive shielding tube 80, a probe holder box 82, first and second coaxial cables 84, 86 inside shielded tube 80, first and second rigid probe extensions 88, 90, and a probe 92.

FIG. 3, an end elevation view is shown of the triaxial termination box 78, shielding tube 80, probe holder box 82 and probe 92. As shown in FIGS. 2 and 3, a pair of flexible coaxial cables 84, 86 each includes a respective inner conductor 84a, 86a and a respective outer conductor 84b, 86b. The inner and outer conductors are coaxially disposed and insulated from one another, and also insulated on the outside by an insulating sheath. As best seen in FIG. 3, the triaxial termination box 78 includes conductive walls 78a defining a shielded enclosure 79 with an access door 78b. The exterior conductors 74c, 76c of the triaxial cables are electrically connected to conductive walls 78a by virtue of the mechanical connections between the triaxial cables and termination box 78. The outer conductors 84b, 86b of coaxial cables 84, 86 are connected to the respective intermediate conductors 74b, 76b of the triaxial cables. The inner conductors 84a, 86a of the coaxial cables are connected to the respective central conductors 74a, 76a of the triaxial cables. Coaxial cables 84, 86 extend through the vertically disposed conductive shielding tube to terminate inside an enclosure in probe holder box 82. Coaxial cables 84, 86 are insulated from shielding tube 80 by their external covering, the shielding tube 80 is supported by the articulated arm 72 of the probe manipulator by means of a collar 73. Movement of the vertical tube inside the opening 76 is facilitated by means of a pair of overlapping sliding conductive disks 67a, 67b. The shielding tube 80 is in contact with the probe station cover assembly 60 and is at ground potential.

Figure 4:
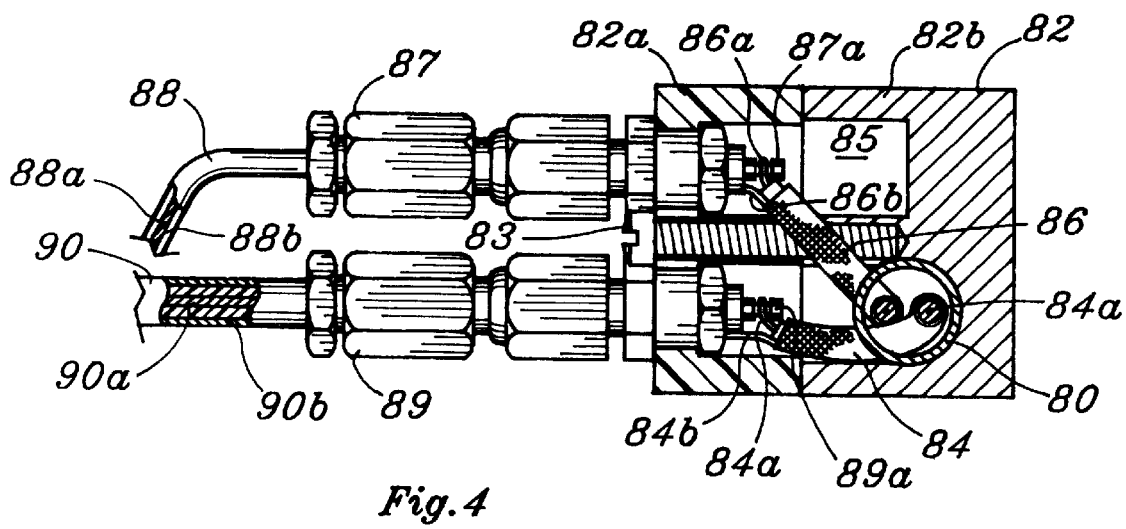

Referring to FIG. 4 of the drawing, the top view is shown of the probe holder box 82. The box is made in two sections, a non-conductive section 82a, and a conductive section 82b secured together by a screw 83 together defining a shielded enclosure 85. A pair of standard coaxial jacks 87, 89 are attached to the non-conductive walls of probe holder box section 82a. Jacks 87, 89 receive the respective ends of first and second rigid probe extensions 88, 90. Each of the rigid probe extensions 88, 90 includes a respective core member 88a, 90a with a coaxially disposed rigid conductive metal sheath 88b, 90b around it. By means of fixtures 87, 89, the conductive sheaths 88b, 90b are supported by the walls of probe holder box section 82a. Electrical connections are made between the outer conductors 84b, 86b of coaxial cables 84, 86 and the conductive sheaths 90b, 88b respectively as seen in the drawing. Similarly, the core members 88a, 90a of the rigid probe extensions are connected by means of extensions 87a, 89a on the fixtures to the inner conductors 86a, 84a respectively as shown in the drawing.

The smaller diameter probe extension 88 is bent so that it lies directly beneath and contiguous with the larger rigid extension 90. The two sheaths 88b, 90b are electrically and mechanically connected over a major portion of their lengths by soldering and support one another to provide a rigid probe support.

Summarizing the electrical paths in the probe holder, a ground path is established by means of the aforesaid conductive connections comprising triaxial exterior conductors 74c, 76c; conductive walls 78a of termination box 78; shielding tube 80 and the conductive wall section 82b of probe holder box 82.

A first guard circuit path is established by means of triaxial intermediate conductor 74b, coaxial outer conductor 86b and probe extension conductive sheath 88b. A second guard circuit path is established by means of triaxial intermediate conductor 76b, coaxial outer conductor 84b and probe extension conductive sheath 90b.

A first center conductor path is established by means of triaxial central conductor 74a, coaxial inner conductor 86a, jack core member 87a and probe extension core member 88*a*. A second center conductor path is established by means of triaxial central conductor 76*a*, coaxial inner conductor 84*a*, jack core member 89*a* and probe extension core member 90*a*.

The first and second guard circuit paths are electrically connected together at the point where the probe extension sheaths 88*b*, 90*b* are soldered together. The first and second center conductor paths are electrically connected together at the probe itself, as will be described below.

Figure 5:
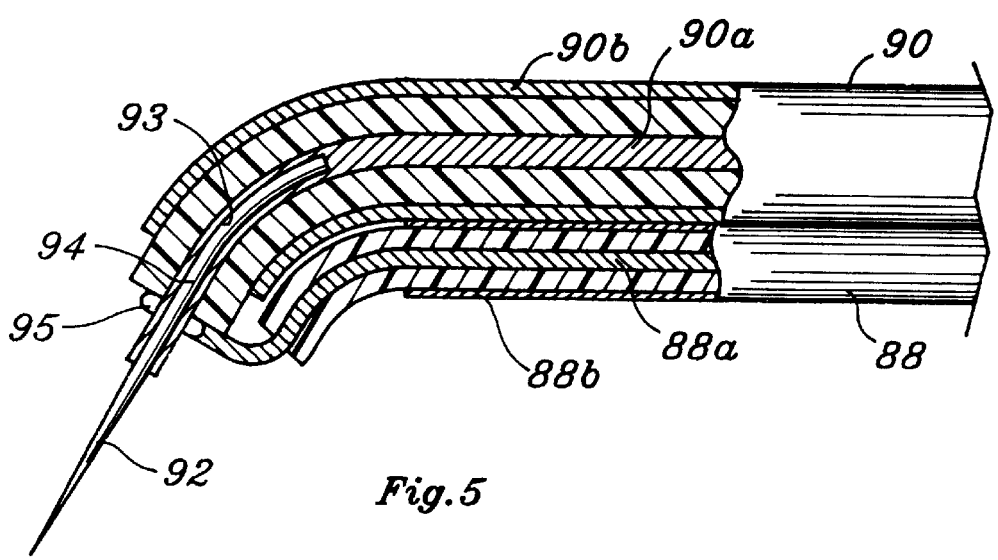

Referring to FIG. 5 of the drawing, the details are shown of the other end of the rigid probe extensions 88, 90. The conductive core member 90*a* is drilled out before it is bent to provide a passage 93 which is slightly curved. Alternatively, the passage 93 can be provided by simply utilizing a core member 90*a* which is tubular rather than solid. Probe 92 has a shank end 94 which is inserted into the passage 93, the friction due to the slight curvature of the passage 93 serving to hold it in position. Therefore probe 92 may easily be replaced by withdrawing and replacing with another probe.

A Kelvin connection is made between the first and second center conductor paths by connecting the core member 88*a* of the underlying rigid probe extension to the probe, which is held in core member 90*a*, as shown at 95. In this manner, the guarding circuit is provided all the way to the probe extensions adjacent the probing area on the device under test, with a Kelvin connection made also adjacent the device under test.

The invention provides improved probing for low voltage, low current testing and an improved and economical construction which reduces congestion around the device under test.

While the applicant has shown what is considered to be the preferred embodiment of the invention, other modifications will occur to those skilled in the art, and it is desired to secure in the appended claims all such modifications as fall within the true spirit and scope of the invention.

What is claimed is:

1. An improved probe holder for making low current, low voltage measurements in a wafer probe station including at least one probe manipulator, a moveable chuck adapted to hold a device under test, and a pair of triaxial cables terminating adjacent the probe manipulator, said triaxial cables having coaxially disposed central conductors, intermediate conductors, and exterior conductors insulated from one another, said probe holder comprising:

a triaxial termination box defining a first shielded enclosure having conductive wall portions adapted for connection to the exterior conductors of each of said triaxial conductors, a conductive shielding tube with upper and lower ends extending downwardly from the triaxial termination box and communicating at the upper end thereof with said first shielded enclosure, a probe holder box supported from the lower end of the shielding tube, said probe holder box defining a second shielded enclosure communicating with the lower end of the shielding tube, first and second coaxial cables each having inner and outer coaxially disposed conductors insulated from one another and extending through the shielding tube between the first and second shielded enclosures and having their outer conductors connected to respective intermediate conductors in the first enclosure and having their inner conductors connected to respective central conductors in the first enclosure, first and second probe extensions, each having a supported end and a free end comprising a conductive core member and a conductive sheath coaxially disposed with respect to said conductive core member and insulted therefrom, said probe extensions each being supported at said supported end and extending outwardly from the probe holder box, said conductive sheaths being connected to respective outer conductors inside the second enclosure, and said conductive core members being connected to respective inner conductors inside the second enclosure, a probe having a shank end supported from at least one of the conductive core members at said free end of the first and second probe extensions, and electrically connected to both of said conductive core members at the free ends, so as to provide a guarded probe with a Kelvin connection adjacent the device under test.

2. An improved probe holder according to claim 1, wherein said probe holder box includes a non-conductive wall section and a conductive wall section, the supported ends of said first and second probe extensions being supported in the con-conductive wall section, said shielding tube supporting the probe holder box by the conductive wall section.

3. An improved probe holder according to claim 1, wherein at least one of said first and second probe extensions has a rigid conductive sheath so as to be self-supporting.

4. An improved probe holder according to claim 1, wherein said conductive sheaths of both the first and second probe extensions are rigid and disposed above one another.

5. An improved probe holder according to claim 1, wherein the shank end of the probe is coaxially disposed within the conductive core member of the first probe extension.

6. An improved probe holder according to claim 1, wherein said conductive sheaths of both the first and second probe extensions are of rigid conductive metal and are electrically and mechanically connected to one another to provide a rigid probe support.

* * * * *